United States Patent [19]
Utech

[11] Patent Number: 5,568,870
[45] Date of Patent: Oct. 29, 1996

[54] DEVICE FOR TESTING AND SORTING SMALL ELECTRONIC COMPONENTS

[75] Inventor: Klaus Utech, Mesa, Ariz.

[73] Assignee: Testec, Inc., Chandler, Ariz.

[21] Appl. No.: 293,011

[22] Filed: Aug. 18, 1994

[51] Int. Cl.⁶ ..................................................... B07C 5/344
[52] U.S. Cl. .............................................................. 209/573
[58] Field of Search ....................................... 209/573, 574, 209/572, 575, 571, 600

[56] References Cited

U.S. PATENT DOCUMENTS

| | | |
|---|---|---|
| 3,581,889 | 6/1971 | Abraham et al. . |
| 3,655,041 | 4/1972 | Baker et al. . |
| 3,810,540 | 5/1974 | Georges . |
| 4,500,003 | 2/1985 | Cedrone . |
| 4,747,479 | 5/1988 | Herrman . |
| 4,978,913 | 12/1990 | Hamuro et al. ..................... 209/573 X |
| 5,131,206 | 7/1992 | Sillner ................................ 209/573 X |

*Primary Examiner*—David H. Bollinger
*Attorney, Agent, or Firm*—Franklin Gubernick

[57] ABSTRACT

The invention is a machine used to test and sort small electronic components. The machine includes a feed station, a testing station and a sorting station. The components are carried between the different stations by a rotatable transport wheel that includes a number of peripherally-located and radially-aligned compartments.

The testing station includes a top lead that is moved in a direction away from or toward the central axis of the wheel. The movement is controlled by a follower roller that is connected to the lead and that travels along a surface of a cam ring that is attached to the transport wheel. The testing station further includes a shielding strip that isolates the electronic component from surrounding fields during the testing operation.

24 Claims, 4 Drawing Sheets

DEVICE FOR TESTING AND SORTING SMALL ELECTRONIC COMPONENTS

FIELD OF THE INVENTION

The invention is in the field of equipment used for testing and sorting small electronic components. More particularly, the invention makes use of a parts feeder that enters the electronic parts into a rotatable transport wheel. The transport wheel includes a plurality of radially-oriented compartments located about its periphery for receiving the individual parts. A vacuum apparatus is connected to each compartment to facilitate entry of the parts and to stabilize the parts during transport. Rotation of the wheel brings each part to a test station that includes a movable top lead and a stationary bottom lead. The station also includes metallic shielding that negates the effect of background field during testing of the parts. After the testing has been completed, the wheel moves each part to a sorting station where the part is directed to a receiving bin based on the test results.

BACKGROUND OF THE INVENTION

As electronic devices have become more common, the number of small electronic components that require testing has increased dramatically. In response to this need, automated test equipment capable of testing large quantities of parts at an exceedingly high speed has become commonplace. There is equipment of this type capable of processing components at a rate of 10,000 parts per hour.

In the testing of electronic components, certain problems are commonly experienced and are often exacerbated as the size of the component being tested decreases. For example, many machines produce vibrations during operation (especially by the mechanism that transports the component between different areas of the machine) that adversely affect the component during its transport and testing. This effect is magnified by the extremely low mass of a small electronic component. For example, the prior art patent issued to Herrman (U.S. Pat. No. 4,747,479) teaches a machine that includes a conveyer belt system for transporting parts from a feed station to a test station. It has been found that the slight vibratory movements of the flexible belt cause relatively substantial movements of the parts carried on the belt. This creates a limit in the machine speed since the parts must remain on the belt during transport and also be stable during testing.

Another problem experienced with testing of electronic components using the prior art devices is that random or background electrical or magnetic fields in the area of the testing station will adversely affect the component's test results. This limits the usefulness of the equipment and creates some degree of uncertainty about the acceptability of the tested parts. In an attempt to overcome this problem, various shielding arrangements have been added to some of the prior art equipment. However, the design of the equipment necessitates the use of a significant amount of shielding. This increases the cost of the machine. In addition, the design limits the effectiveness of the shielding whereby accurate testing above a frequency of 30 megahertz is virtually impossible.

SUMMARY OF THE INVENTION

The invention is a machine designed to rapidly test and sort small electronic components. The machine includes a feed station, a test station and a sorting station. A transport wheel is used to bring the parts between each of the stations in a controlled and rapid manner.

The machine is preferably adapted to handle small electrical or electronic components that have two terminals, with each terminal located at an opposite end of the part. Examples of this type of part are chip resistors, chip inductors and chip-capacitors. These parts will typically range in size from 0.04 to 0.12 inches in length by 0.02 to 0.06 inches in diameter.

The feed station includes a bulk receiver designed to handle bulk inputting of electronic components. A dispenser separates the components and then outputs them in a controlled manner.

The parts are directed from the feed station into individual compartments located about the periphery of the transport wheel. Each compartment is oriented so that its longitudinal axis intersects the central axis of the wheel. Once a component is received within one of the compartments, the component will be aligned with the plane of the wheel with one end proximate the top of the compartment. In the preferred embodiment, each compartment is connected to a vacuum source to facilitate re-orienting of the parts to match the compartments during the loading operation and also to aid in retaining and stabilizing the parts when they are within the compartments.

The wheel is connected by a flexible timing belt to a highly precise motor that causes an indexed rotation of the wheel. As parts are received in the compartments, they move with the wheel and are transported in a highly stable manner to the machine's test station.

The test station is located approximately thirty degrees about the wheel's circumference from the feed station. The test station includes a movable upper arm that is controlled by a cam-type engagement with the transport wheel. The upper arm includes a lead that is electrically connected to a testing apparatus. As each part arrives at the test station, the arm descends to achieve a sweeping contact of the lead onto the end of the part.

Located in the plane of the wheel but below the ring of part-receiving compartments is a stationary disk that has a ring of low-friction material about its periphery. Located in the ring, at a position opposite the movable arm of the test station, is a second lead that is connected to the testing apparatus. As each part is transported into the test station, the bottom end of the part sweeps along the face of the lead to thereby complete the connection with the testing equipment.

Also located at the test station is a relatively small metallic shielding strip that is positioned to be extremely close-fitting on the part being tested and is thereby highly effective at shielding the part from surrounding electrical and magnetic fields. The strip is stationary and extends between the top and bottom leads and thereby covers the electronic part during testing. The shielding design allows testing of parts at signal frequencies up to between 200 and 500 megahertz with a measurement accuracy of plus or minus ten percent.

After the testing of a component has been completed, the wheel then transports the component to a sorting station. The sorting station includes a number of conduits, with each conduit leading to a different one of a plurality of bins. Based on the results of the test, the component is pneumatically ejected from the wheel into the appropriate conduit and thereby into a specific one of the bins.

After the component has been ejected from the wheel, rotation of the wheel returns the now empty compartment to the feed station where a new component to be tested is entered. When operating at its full speed, the above-described machine is capable of testing and sorting up to approximately fifty thousand parts per hour.

DETAILED DESCRIPTION OF THE DRAWINGS

Figure 1:
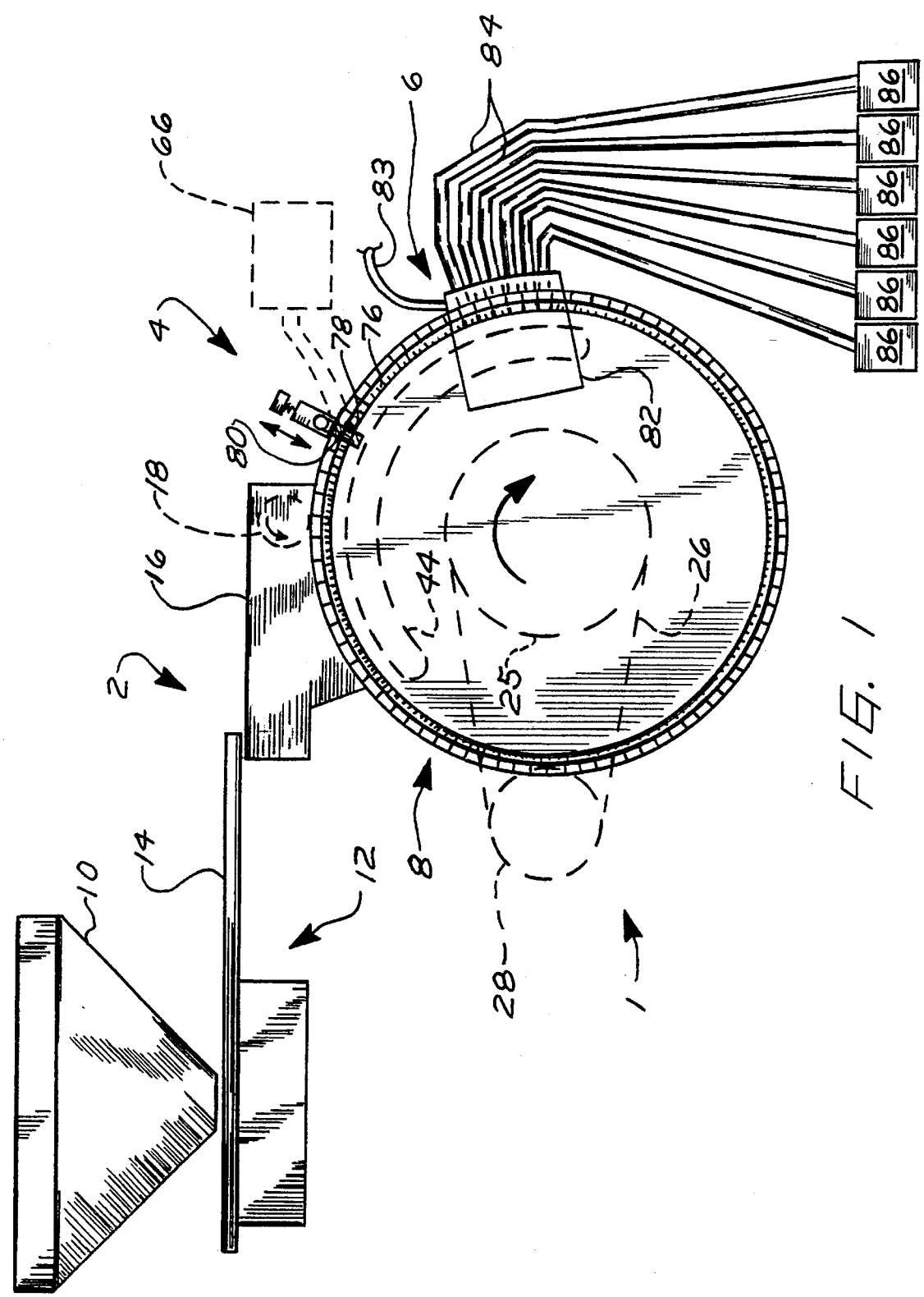
FIG. 1 is a front view of a component testing and sorting machine in accordance with the invention.

Referring now to the drawings in greater detail, wherein like reference characters refer to like parts throughout the several figures, there is shown by the numeral 1 a device for testing and sorting small electronic components.

FIG. 1 provides a front view of a machine in accordance with the invention. The machine includes a feed station 2, a test station 4, a sorting station 6 and a transport wheel 8. In the preferred embodiment, each of the stations and the transport wheel are all combined in a single cabinet-type unit.

The feed station 2 includes a funnel-like hopper 10 into which small electronic components (also referred to as "parts") 11 such as chip resistors are inputted in bulk quantities. The hopper empties into a transfer apparatus 12 that includes a vibrating unit (not shown) that facilitates separation of the parts and their movement along ramp 14.

The ramp empties into a dispenser 16 that is designed to hold a relatively small number of the parts. Once in the dispenser, the parts may exit it through an outlet formed by an opening in its bottom portion. As parts leave the dispenser, they are directly received by the transport wheel 8. It should be noted that the dispenser includes a sweeper wheel 18 that continually rotates in an opposite direction from that of the transport wheel. The sweeper wheel functions to prevent the parts from escaping from the end of the dispenser and also helps to maintain the parts toward the left side portion of the dispenser.

Figure 2:
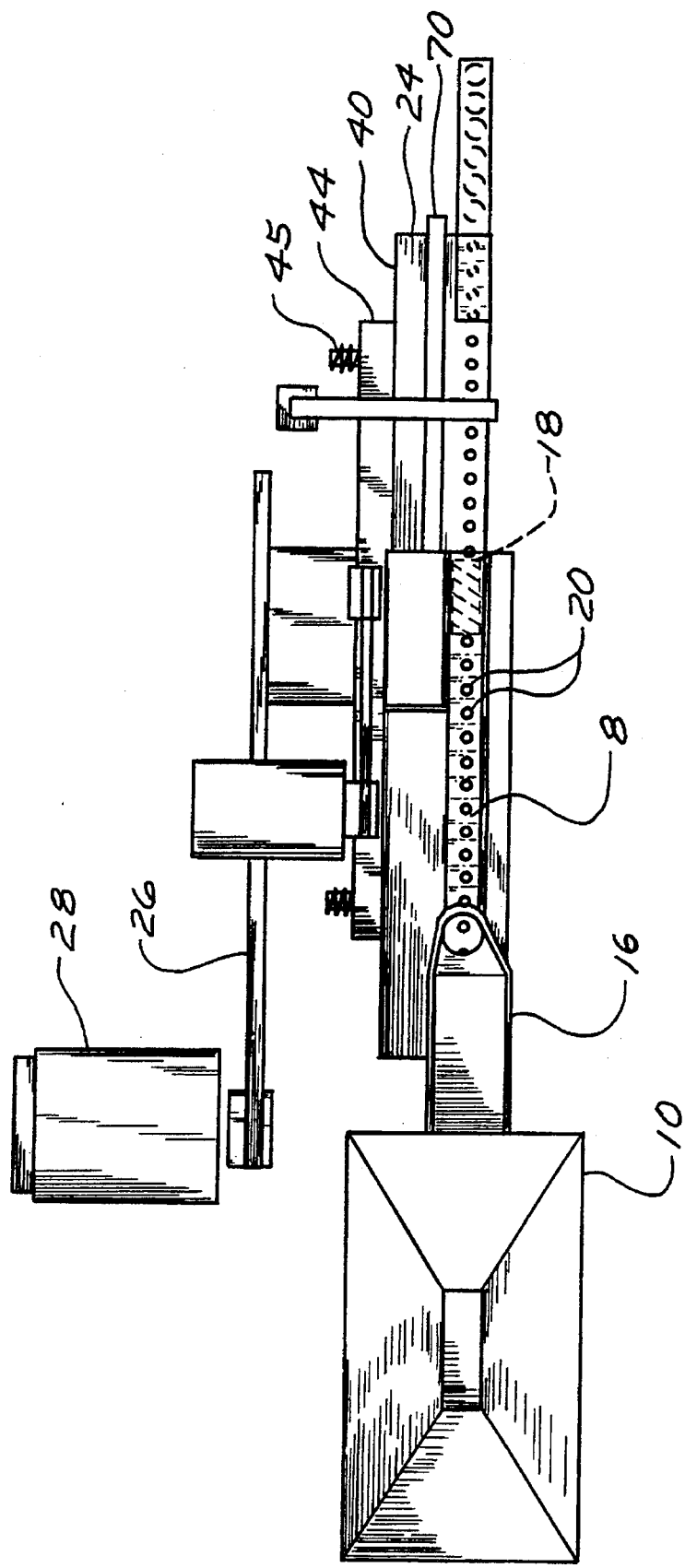
FIG. 2 is a top view of the machine shown in FIG. 1.

FIG. 2 provides a top view of the machine. In this view, the relationship between the feed station and the transport wheel may be clearly viewed. When a part leaves dispenser 16, it is received within a tubular, complementary-sized compartment 20 located on the outer rim of the transport wheel 8. As can be seen, the centerline of the dispenser outlet matches the center of the line of compartments 20 located on the wheel.

Figure 3:
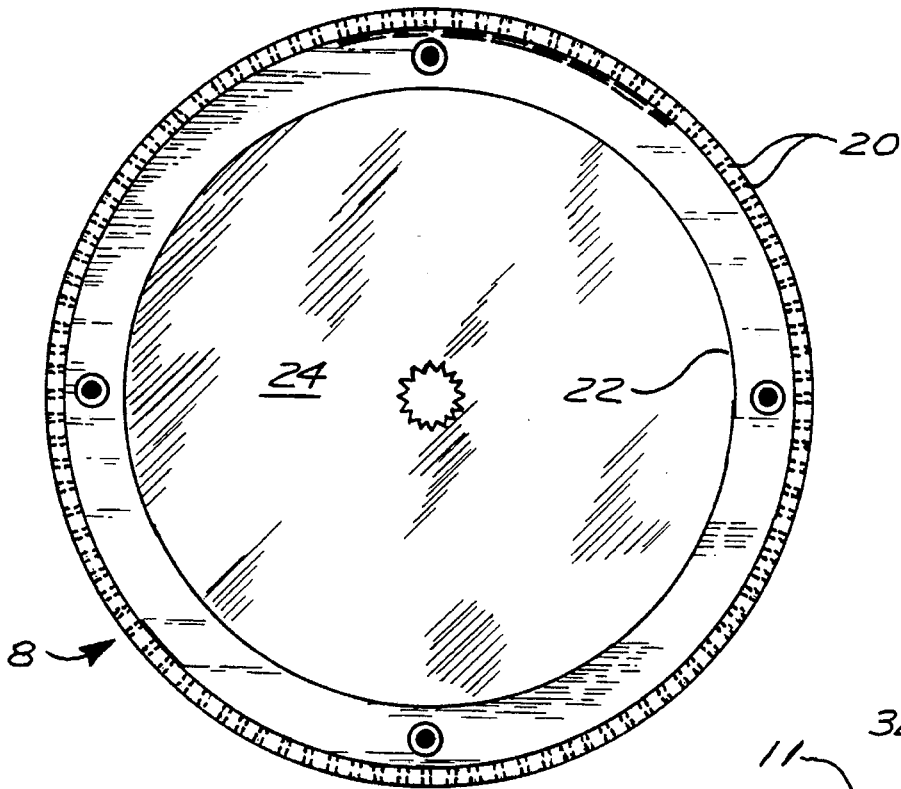
FIG. 3 is a front view of the transport wheel.

FIG. 3 shows a front view of the wheel 8. As can be seen in this view, there are a large number of compartments 20 in a closely-spaced linear pattern about the outer edge of the wheel. The compartments are located in a ring-shaped rim member 22 that forms the periphery of the wheel. In the preferred embodiment, the rim member is made of a rigid plastic material and is approximately twelve to eighteen inches in diameter. The rim member is removable from a metal hub 24 and can be replaced by other rim members that have different size compartments 20 to fit other sizes of components 11. The hub 24 has a pulley 25 (shown in FIG. 1) fixed to its rear surface that is connected by belt 26 to an electric motor 28.

Figure 4:
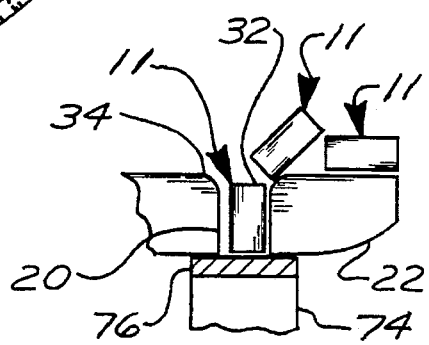
FIG. 4 is a cross-sectional view of electronic components being entered into the periphery of the transport wheel in the area of the feed station.

FIG. 4 shows a number of electrical components 11 as they are being entered into the receiving compartments 20 of the wheel from dispenser 16. In the figure, one of the parts 11 is shown at the point where it has been fully received within the compartment and has become oriented so that the top end 32 of the part is located at the top, outer portion 34 of the compartment. As the wheel rotates, each of the parts 11 will enter an empty compartment and become radially-located on the wheel with the part's longitudinal axis oriented to intersect the wheel's central axis.

Figure 5:
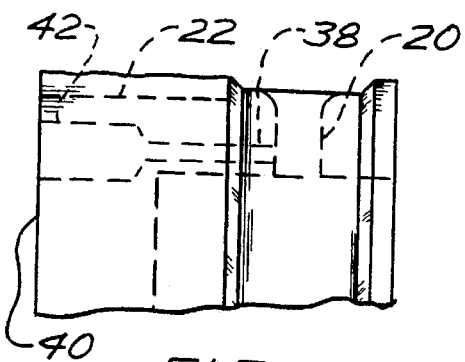
FIG. 5 is a side view of a portion of the transport wheel and surrounding structure.
Figure 6:
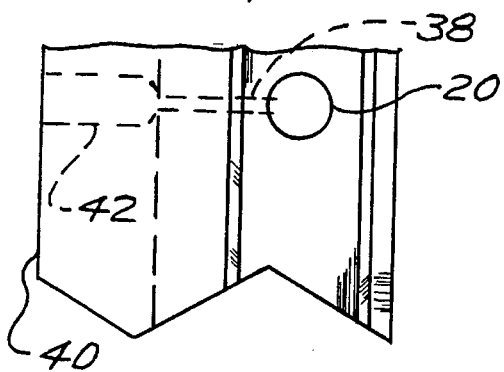
FIG. 6 is a top view of the structure shown in FIG. 5.

In the preferred embodiment, the wheel 8 is connected to a vacuum source 36 (note FIGS. 5–7) to thereby provide a vacuum force to each compartment 20. The vacuum helps to orient the components 11 as they are received within the compartments and also aids in retaining and stabilizing the components when they are located within the compartments.

Figure 7:
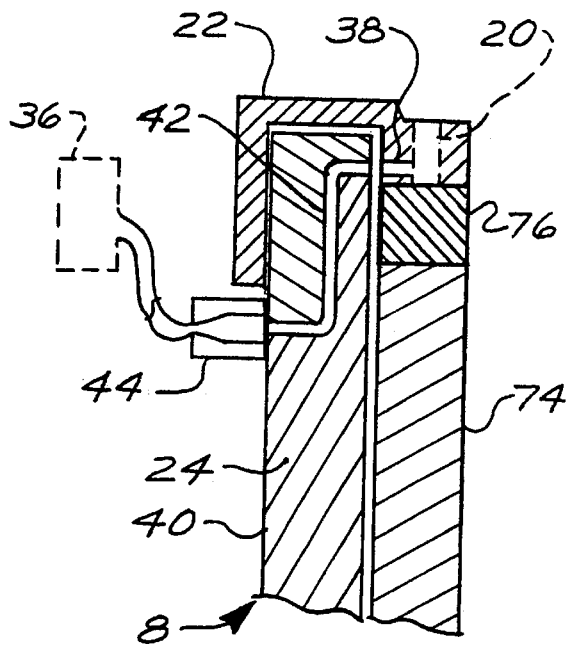
FIG. 7 is a cross-sectional view of a portion of the transport wheel and surrounding structure whereby the attachment to a vacuum source is shown.

Each compartment 20 of the wheel has a port 38 that is connected to the rear face 40 of the wheel. FIG. 7 shows how the port 38 is continuous with a complementary passage 42 in hub member 24. Passage 42 is operatively connected to a channel-like, curved vacuum supply fitting 44 that is in continuous contact with the rear surface of the wheel (note FIG. 1). Since wheel 8 rotates during operation, springs 45 are used to continually press stationary fitting 44 against the rear surface of the wheel. To reduce friction, fitting 44 is manufactured from a low-friction plastic material. The fitting is connected by tube 46 to the vacuum source 36.

Figure 9:
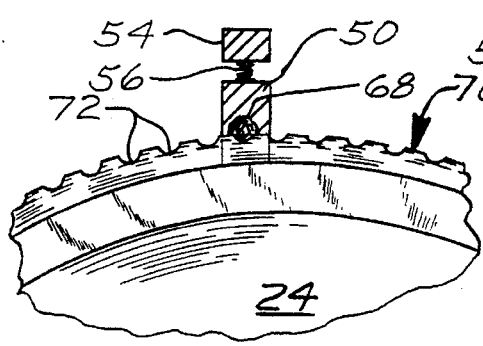
FIG. 9 is a detailed front view with portions removed of the top portion of the transport wheel in the area of the test station.
Figure 10:
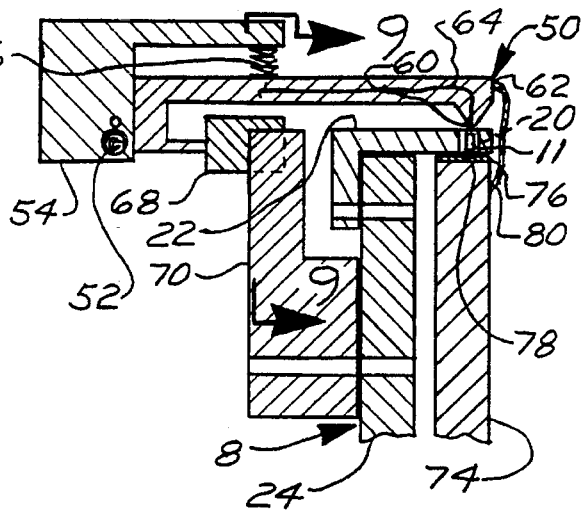
FIG. 10 is a side view of the top of the transport wheel and the test station.
Figure 8:
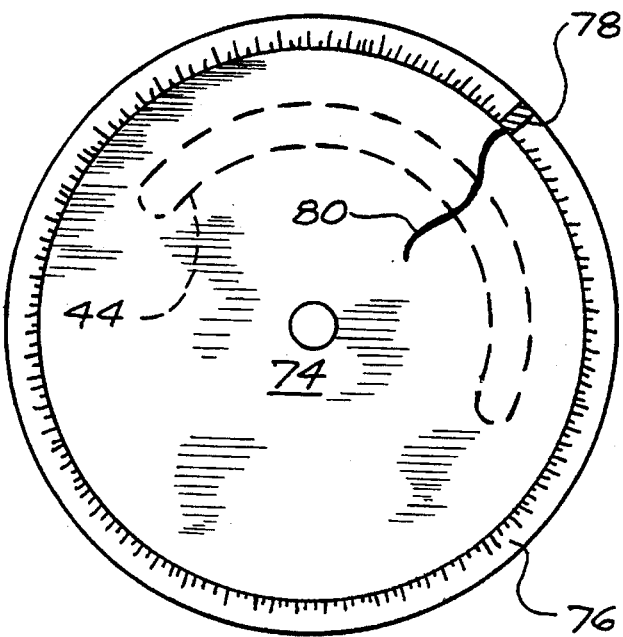
FIG. 8 is a front view of the plate that is mounted in front of the transport wheel.

Rotation of wheel 8 brings a part 11 located within one of the compartments 20 from the feed station 2 to the test station 4. Various portions of the test station are shown in FIGS. 8–10.

The test station includes a movable arm 50 that is connected by a pivot 52 to a stationary support member 54. A spring 56 maintains a downward bias on the arm. An electrical contact 60 is mounted to the bottom surface of an outer portion 62 of the arm. The contact is connected by a wire 64 to a testing apparatus or instrument 66 such as an oscilloscope.

The arm 50 includes a follower member 68 that rides on a cam ring 70 (partially shown in FIGS. 8 and 9) that is attached to the back surface of hub 24 of wheel 8. The cam ring includes a plurality of indentations 72 that allow the follower member and the attached arm 50 to periodically move in a downwardly motion directed toward the center of the wheel. This downward movement is thereby synchronized to the rotation of the wheel so that as each part 11 is moved into the test station, arm 50 moves downwardly and contact 60 achieves a sliding engagement with the top end 32 of the part. It should be noted that each compartment 20 has an associated indentation on the cam ring.

Located below the rim member 22 of the wheel is a stationary disk-like support member 74 (shown in FIG. 8). Attached to the periphery of the member is a ring 76 of low-friction plastic material that has embedded within it an electrical contact 78 positioned directly opposite contact 60.

Contact 78 is connected by wire 80 to the electrical testing apparatus 66 in the same manner as contact 60. As the wheel rotates, the bottom end of a part 11 will slide along the top surface of ring 76 until the part moves to the test station where the bottom of the part is brought into engagement with the lower contact 78.

The upper and lower contacts (also known as "leads"), 60 and 78 respectively, act together to temporarily connect part 11 to the testing instrument 66. After the part has been tested, the wheel rotates to bring the next part 11 into the test station. It should be noted that while one set of contacts 60 and 78 are shown, the test station may include multiple sets of contacts to thereby enable the simultaneous testing of multiple components 11.

Due to the short distance between the contacts and the radial positioning of the part 11 within the periphery of the wheel, only a minimal amount of shielding is required to protect the part form exterior fields during the testing process. To accomplish this, a flexible metal strip 80 is employed that extends between the contacts and covers the front of the part when the part is being tested. The design of the transport wheel allows the strip to be placed at an extremely close distance to the component 11. In the preferred embodiment, the strip is spaced only 5–8 millimeters away from the component. It should be noted that the strip is not required to be fixed to the movable arm 50 and may be secured to a non-moving structure.

After the testing has been completed, rotation of the wheel brings the part 11 to the sorting station 6. This station includes a block 82 that houses a series of electrically-operated solenoid valves (not shown). In the preferred embodiment, each valve is connected to a source 83 of pressurized air and is located so that it points to one of the compartments 20 facing the block. Aligned with the compartments and the valves are a plurality of tubes 84 with each tube being specific to one of the compartments 20 and extending to it's own dedicated part-receiving bin 86.

After a part has been tested at the test station, its test results are temporarily stored by the testing instrument. The testing instrument is operatively connected to the solenoid valves so that, based on the test results determined at the test station, when a part 11 reaches an appropriate position, it will be aligned with a particular one of the valves. The valve is indirectly caused to open by the test instrument and pressurized air is then directed from the valve into the compartment 20 that is adjacent to the valve. This forces the part 11 in that compartment to be pushed into the adjacent tube 84 and thereby into the appropriate receiving bin 86.

Figure 11:
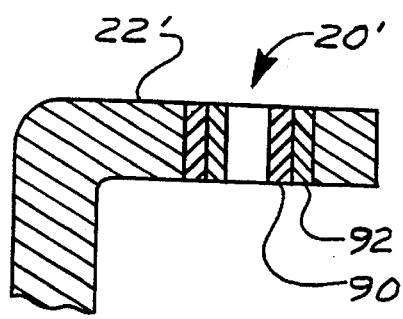
FIG. 11 provides a cross-sectional view of an alternate embodiment of a compartment in the test wheel adapted to receive a small electronic component.

In FIG. 11, a second embodiment of the rim member 22' of the wheel 8 is shown. In this embodiment, the compartment includes an inner plastic sleeve 90 surrounded by a metal shielding cylinder 92. The use of the shielding cylinder negates the need for the exterior shielding strip 80. Another shielding alternative is to employ a rim member 22 that is made of metal and have plastic inserts located in each compartment.

The embodiments disclosed herein have been discussed for the purpose of familiarizing the reader with the novel aspects of the invention. Although preferred embodiments of the invention have been shown and described, many changes, modifications and substitutions may be made by one having ordinary skill in the art without necessarily departing from the spirit and scope of the invention as described in the following claims.

I claim:

1. A device for testing and sorting electrical components, said device comprising:

a feed station, said feed station having an inlet, an outlet and adapted to receive bulk quantities of electrical components;

a rotatably mounted transport wheel, said wheel having an outer rim portion that includes a plurality of separate, spaced-apart compartments adapted to receive electrical components from the feed station whereby each of said compartments has a central axis that is oriented perpendicular to the axis of the wheel;

a test station that includes a fixed first electrical contact and a second electrical contact that is movable in a direction away from said wheel and wherein when an electrical component is located within the test station, the first and second contacts will automatically become connected to the component;

testing apparatus operatively connected to the first and second electrical contacts of the test station;

a cam means attached to said wheel;

a cam engagement means connected to said second contact and engaged to said cam means whereby rotation of said wheel causes the cam means to move and thereby cause a movement of the cam engagement means whereby said movement of the cam engagement means causes movement of the second contact;

a sorting station operatively connected to the testing apparatus whereby an electrical component that is within the sorting station can be directed by a transfer means into one of at least two receiving means based on the testing performed at the test station; and wherein when an electrical component is located in one of the compartments of the wheel, said component is transported from the feed station to the test station and then to the sorting station while remaining in said compartment.

2. The device of claim 1 wherein the first contact of the test station is biased by a biasing means against movement in a first direction.

3. The device of claim 2 wherein the biasing means is a spring.

4. The device of claim 1 wherein each of said compartments on said wheel has an open top end and an open bottom end and wherein the first contact of the test station is secured to a member that is located proximate a perimeter of the wheel whereby when an electrical component is located within one of the wheel-located compartments, one end of said component can brush against the first contact when said component moves within the test station.

5. The device of claim 1 further comprising a metal shield member that at least partially surrounds an area located between the first and second contacts of the test station.

6. The device of claim 1 wherein each of said compartments of said wheel is connected by a vacuum transmission means to a vacuum source whereby a vacuum can be applied to said compartments.

7. The device of claim 1 wherein the transfer means of the sorting station comprises a pressurized air system having a source of pressurized air, an outlet operatively connected by an air transfer means to said source of pressurized air and a control means that is capable of controlling air flow between said outlet and said source of pressurized air whereby when a component is located in one of said wheel-located compartments and is in the sorting station, pressurized air can be applied to said component from said outlet and cause said component to be ejected from said compartment.

8. The device of claim 1 further comprising a motor operatively connected to said transport wheel and functioning to cause said wheel to rotate at a controlled speed.

9. A device for testing and sorting electronic components, said device comprising:

a rotatable transport wheel, said wheel having a plurality of separated compartments located in a ring about a periphery of said wheel, each of said compartments having a central axis that is oriented to substantially intersect a center axis of said wheel and wherein said compartments are each sized to receive an individual electronic component;

a vacuum means in the form of a vacuum transfer means that is connected to a source of vacuum and at least one of said compartments of said wheel and wherein said vacuum means functions to create a vacuum within said at least one of said compartments of said wheel;

a test station having electrical connecting means operatively connected to a testing means, whereby when an electronic component is located in one of the wheel-located compartments and is in the test station, said electrical connecting means function to temporarily electrically connect the testing means to said component;

a sorting station spaced apart from the test station and operatively connected to the testing means, said sorting station including means capable of directing an electronic component located in one of the wheel-located compartments to one of a plurality of receiving areas; and wherein said transport wheel functions to transport electronic components in a segregated fashion between the test station and the sorting station.

10. The device of claim 9 wherein the electrical connecting means of the test station comprises a first lead and a second lead.

11. The device of claim 10 wherein the first lead is located on a movable support arm.

12. The device of claim 11 further comprising a cam means connected to said transport wheel and wherein said support arm includes a follower means that is engaged to the cam means whereby rotation of the cam means functions to cause said support arm to intermittently move in a direction away from the ring of compartments.

13. The device of claim 12 wherein the cam means includes a cam ring attached to the transport wheel and rotatable therewith, said cam ring having a contoured surface and wherein said follower means travels on the contoured surface of the cam ring and thereby moves the support arm in accordance with the contoured surface of the cam ring.

14. The device of claim 10 further comprising a metal shielding means that extends between the first and second leads.

15. The device of claim 9 wherein the transport wheel includes a plurality of vacuum transfer ports that can be connected to the vacuum transfer means to thereby transfer vacuum from the vacuum source to said vacuum transfer ports and wherein each of said vacuum transfer ports is connected to at least one of the wheel-located compartments.

16. The device of claim 15 wherein the vacuum transfer means includes a fitting that abuts a first surface of the transport wheel.

17. The device of claim 16 wherein the fitting of the vacuum transfer means does not revolve with the wheel and is spring-biased against the transport wheel.

18. A device for testing and sorting electronic components, said device comprising:

a rotatable transport wheel, said wheel having a plurality of separated compartments located about its periphery, each of said compartments having a central axis that is oriented to substantially intersect a center axis of said wheel and wherein said compartments are sized to receive an individual electronic component;

a test station having two spaced-apart electrical contacts operatively connected to an electronic testing means, whereby when an electronic component is within the test station, said contacts are temporarily connected to said component thereby connecting the testing means to said component, and wherein said test station includes metallic shielding located in a position to at least partially cover said component during testing and to be spaced away from said component by a distance of no more than ten millimeters, and whereby said shielding enables the component to be tested at signal frequencies up to 200 megahertz with a ninety percent accuracy; and a sorting station operatively connected to the electronic testing means, said sorting station including means for directing an electronic component located in one of the compartments of the transport wheel to one of a plurality of receiving means.

19. A device for testing and sorting electrical components, said device comprising:

a feed station, said feed station having an inlet, an outlet and adapted to receive bulk quantities of electrical components;

a rotatably mounted transport wheel, said wheel having an outer rim portion that includes a plurality of separate, spaced-apart compartments adapted to receive electrical components from the feed station whereby each of said compartments has a central axis that is oriented perpendicular to the axis of the wheel;

a test station that includes a fixed first electrical contact and a second contact that is movable in a direction away from said wheel and wherein when an electrical component is located within the test station, the first and second contacts will automatically become connected to the component;

testing apparatus operatively connected to the first and second electrical contacts of the test station;

a metal shield member that extends between the first and second contacts of the test station;

a sorting station operatively connected to the testing apparatus whereby an electrical component that is within the sorting station can be directed by a transfer means into one of at least two receiving means based on the testing performed at the test station; and wherein when an electrical component is located in one of the compartments of the wheel, said component is transported from the feed station to the test station and then to the sorting station while remaining in said compartment.

20. A device for testing and sorting electronic components, said device comprising:

a rotatable transport wheel, said wheel having a plurality of separated compartments located about a peripheral portion of said wheel, and wherein each of said compartments is sized to receive an individual electronic component;

a vacuum means in the form of a vacuum transfer means that is connected to a source of vacuum and at least one of said compartments of said wheel and wherein said vacuum means functions to create a vacuum within said at least one of said compartments of said wheel;

a test station having electrical connecting means operatively connected to a testing means, whereby when an electronic component is located in one of the wheel-located compartments and is in the test station, said electrical connecting means function to temporarily electrically connect the testing means to said component;

a sorting station spaced apart from the test station and operatively connected to the testing means, said sorting station including transfer means that is capable of causing the transfer of an electronic component located in one of the wheel-located compartments to a receiving area; and wherein said transport wheel functions to transport electronic components in a segregated fashion between the test station and the sorting station.

21. A device for testing and sorting electronic components, said device comprising:

a rotatable transport wheel, said wheel having a plurality of separated compartments located about a peripheral portion of said wheel, and wherein each of said compartments is sized to receive an individual electronic component;

a test station having first and second electrical connecting means operatively connected to a testing means, whereby when an electronic component is located in one of the wheel-located compartments and is in the test station, said first and second electrical connecting means function to temporarily electrically connect the testing means to said component;

a cam means attached to said wheel;

a cam engagement means connected to said first electrical connecting means and engaged to said cam means whereby rotation of said wheel causes the cam means to move and thereby cause a movement of the cam engagement means whereby said movement of the cam engagement means causes movement of the first electrical connecting means;

a sorting station spaced apart from the test station and operatively connected to the testing means, said sorting station including transfer means that is capable of causing the transfer of an electronic component located in one of the wheel-located compartments to a receiving area; and wherein said transport wheel functions to transport electronic components in a segregated fashion between the test station and the sorting station.

22. The device of claim 21 wherein the cam means includes a cam ring attached to the transport wheel and rotatable therewith, said cam ring having a contoured surface and wherein said cam engagement means includes a portion that travels on the contoured surface of the cam ring and thereby moves a terminal portion of the first electrical connecting means in accordance with the contoured surface of the cam ring.

23. A device for testing and sorting electronic components, said device comprising:

a rotatable transport wheel, said wheel having a plurality of separated compartments located about a peripheral portion of said wheel, and wherein each of said compartments is sized to receive an individual electronic component;

a test station having first and second electrical connecting means operatively connected to a testing means, whereby when an electronic component is located in one of the wheel-located compartments and is in the test station, said first and second electrical connecting means function to temporarily electrically connect the testing means to said component;

a metal shield member that at least partially surrounds an area located between the first and second electrical connecting means of the test station;

a sorting station spaced apart from the test station and operatively connected to the testing means, said sorting station including transfer means that is capable of causing the transfer of an electronic component located in one of the wheel-located compartments to a receiving area; and wherein said transport wheel functions to transport electronic components in a segregated fashion between the test station and the sorting station.

24. The device of claim 23 wherein the shield member is flexible.

* * * * *

UNITED STATES PATENT AND TRADEMARK OFFICE
CERTIFICATE OF CORRECTION

PATENT NO. : 5,568,870
DATED : Oct. 29, 1996
INVENTOR(S) : Klaus Utech

It is certified that error appears in the above-indentified patent and that said Letters Patent is hereby corrected as shown below:

In Claim 2, line 1 "first" should read -- second --.

Signed and Sealed this

Eighth Day of April, 1997

Attest:

BRUCE LEHMAN

*Attesting Officer*  *Commissioner of Patents and Trademarks*